United States Patent [19]
Ziegler, Jr.

[11] Patent Number: 5,105,377
[45] Date of Patent: Apr. 14, 1992

[54] DIGITAL VIRTUAL EARTH ACTIVE CANCELLATION SYSTEM

[75] Inventor: Eldon W. Ziegler, Jr., Columbia, Md.

[73] Assignee: Noise Cancellation Technologies, Inc., Linthicum, Md.

[21] Appl. No.: 477,432

[22] Filed: Feb. 9, 1990

[51] Int. Cl.$^5$ .............................................. G06F 15/31
[52] U.S. Cl. ........................ 364/724.01; 364/724.19; 381/71
[58] Field of Search ........... 364/724.19, 724.2, 724.01; 381/71

[56] References Cited

U.S. PATENT DOCUMENTS

| | | | |
|---|---|---|---|
| 4,566,118 | 1/1986 | Chaplin et al. | 381/71 |
| 4,677,677 | 6/1987 | Eriksson | 381/71 |
| 4,878,188 | 10/1989 | Ziegler, Jr. | 364/724.01 |

Primary Examiner—David H. Malzahn
Attorney, Agent, or Firm—James W. Hiney

[57] ABSTRACT

A digital virtual earth active cancellation system which receives a phenomena input signal representing residual phenomena to be cancelled and has an adaptive filter which generates a cancellation signal. A system impulse response is convolved with the cancellation signal and is subtracted from the input signal to produce an estimate of noise. This substantially eliminates the problems associated with destructive feedback due to phase shifts. The residual signal is used to control an adaptive filter that receives the estimated noise as an input. The adaptive filter produces the cancellation signal by filtering the estimated noise with filter weights that are adapted using the residual signal and the estimated noise convolved with the system impulse response.

32 Claims, 4 Drawing Sheets

DIGITAL VIRTUAL EARTH ACTIVE CANCELLATION SYSTEM

FIELD OF THE INVENTION

The present invention relates to active cancellation systems for repetitive or non-repetitive phenomena, and more specifically, to an active cancellation system that provides cancellation phenomena without requiring an external reference or timing signal.

BACKGROUND OF THE INVENTION

The simplest active cancellation for phenomena is an analog negative feedback system, also referred to as "a virtual earth" system. In such systems, phenomena is sensed and the sensor input signal is provided to an inverting amplifier. A cancellation signal is sent to an actuator, which provides cancellation phenomena into the area in which the phenomena is to be cancelled.

A problem with analog feedback systems is that they become unstable and produce destructive positive feedback due to phase shifts. These phase shifts are typically due to delays such as that resulting from the distance between the sensor and the actuator, and also by echos. The phase shifts vary by frequency and have not been amenable to a solution in the analog feedback systems except over a very narrow range of frequencies or in a very confined environment, such as a headphone.

Digital cancellation systems have been provided for cancelling repetitive noise. One such system has been described in "Adaptive Noise Cancelling Principals and Applications", by Widrow et al. in Proceedings IEEE Vol. 63, No. 12, December, 1975, which describes two forms of active adaptive cancellers. The first, illustrated in FIG. 5 of that paper uses a multi-tap adaptive FIR filter with a reference signal correlated with the noise to be cancelled. The reference signal is required to be within 90° in phase of the error signal. Consequently, the reference signal used by the adapter itself often requires filtering. This approach is referred to as the "filtered-x algorithm". This approach requires two sensors and does not account for variable delays in the system.

The second form described by Widrow et al. is illustrated in FIG. 6 of that paper, and provides a single frequency notch filter and requires only two single tap filters. Again, a reference signal correlated with the noise is used and is phase shift 90° for one of the filters. This approach cannot operate without the reference signal and does not account for variable delays in the system.

Therefore, there is a need for an active cancellation system for repetitive or non-repetitive phenomena which uses only a single sensor, solves the instabilities and extends the frequency range over that of the conventional analog virtual earth systems, accounts for environmentally produced delays, and is adaptable to maintain an appropriate phase relationship without the use of external reference signals.

SUMMARY OF THE INVENTION

A digital virtual earth cancellation system is provided according to the present invention which receives a phenomena input signal representing residual phenomena to be cancelled and includes an adaptive filter for generating a cancellation signal. The adaptive filter adapts its filtering characteristics as a function of the difference between the residual signal and the estimated effects of the cancellation signal. A phase circuit maintains the adapting of the filtering characteristics and 90° phase of the phenomena signal.

In the present invention, the impulse response of the entire cancellation system, which includes delays introduced by filters and other factors, is convolved with the output of the cancellation system, i.e. the cancellation signal. This value is subtracted from the residual signal that is received by the cancellation system, to provide an estimate of the noise. This substantially eliminates the problems associated with destructive feedback due to phase shifts. The residual signal is used to control an adaptive filter that receives the estimated noise as an input. The adaptive filter produces the cancellation signal by filtering the estimated noise with filter weights that are adapted using the residual signal and the estimated noise convolved with the system impulse response.

By convolving the estimate of the noise with the system impulse response to adapt the filter, the values sent to an adapter for the adaptive filter are kept within 90° phase of the residual signal to provide convergence of the adaptation.

In some environments, certain frequency components may be desired and should not be cancelled. Examples includes alarms, speech and other signals. An embodiment of the present invention removes the wanted signals or the signal components from the residual signal in order to prevent their cancellation. For doing this, a filter is provided that removes the desirable frequency components or causes signals with desirable characteristics to be uncorrelated and thereby prevent their cancellation.

An embodiment of the present invention measures the system impulse response and includes a test signal generator for generating a test signal which is combined with the cancellation signal and provided in the area to be monitored. An adaptive filter is provided that receives a random test signal and provides a filtered signal. A difference is produced between the filtered signal and the phenomena residual signal. An adapter adapts the filter weights of this adaptive filter as a function of the difference signal and a delay line of test signal values. The filter weights represent the measured impulse response of the system.

Other advantages and novel features of the present invention will become apparent from the following detailed description of the invention when considered in conjunction with the accompanying drawings.

DETAILED DESCRIPTION

Figure 1:
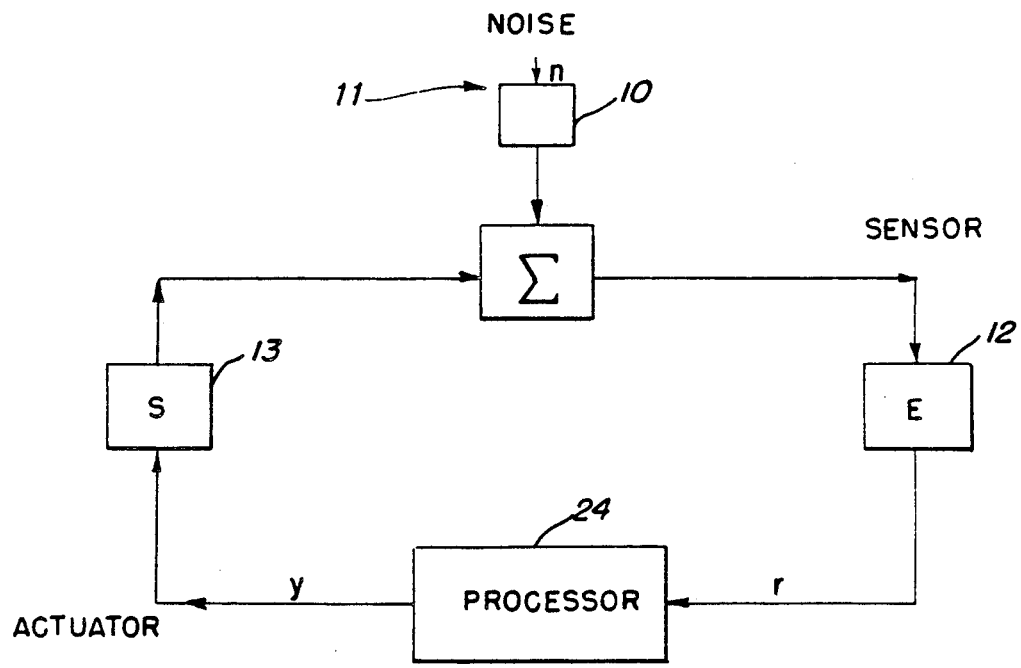
FIG. 1 is a block diagram showing a virtual earth active cancellation system with the impulse responses that are associated with the system.

FIG. 1 shows a basic block diagram of a virtual earth, negative feedback system. Phenomena (such as noise) is detected by a sensor 10, which send out a sensor signal. This sensor signal is affected by an anti-aliasing filter (not shown in FIG. 1) and other factors which have an impulse response E. The sensor signal, as affected by the impulse response E, results in a residual signal r to a processor 24. From the residual signal r, the processor 24 produces an output signal y, the signal being the cancellation signal y. The cancellation signal y, used to form the cancelling phenomena, is affected by filters, transit delays, and other factors which have an impulse response S. The output from the actuator 22, the cancellation phenomena, combines with the original phenomena and the residual is detected at a location 11 by the sensor 10.

The signal values are given by $$r(t) = (y(t) * S + n(t)) * E$$

where:

n(t) is the noise at time t, r(t), y(t), S and E are as described above and a * b is the convolution of a and b.

An estimate of the noise itself can be obtained by rearranging the above equation as $$n(t) * E = r(t) - y(t) * (S * E)$$

The noise n(t) convolved with the impulse response E is found by subtracting the effects of the processor output y, as convolved by S and E, from the residual signal r received by the processor 24. The average power of r can be minimized by a gradient descent method, such as a known least mean square (LMS) algorithm.

Figure 2:
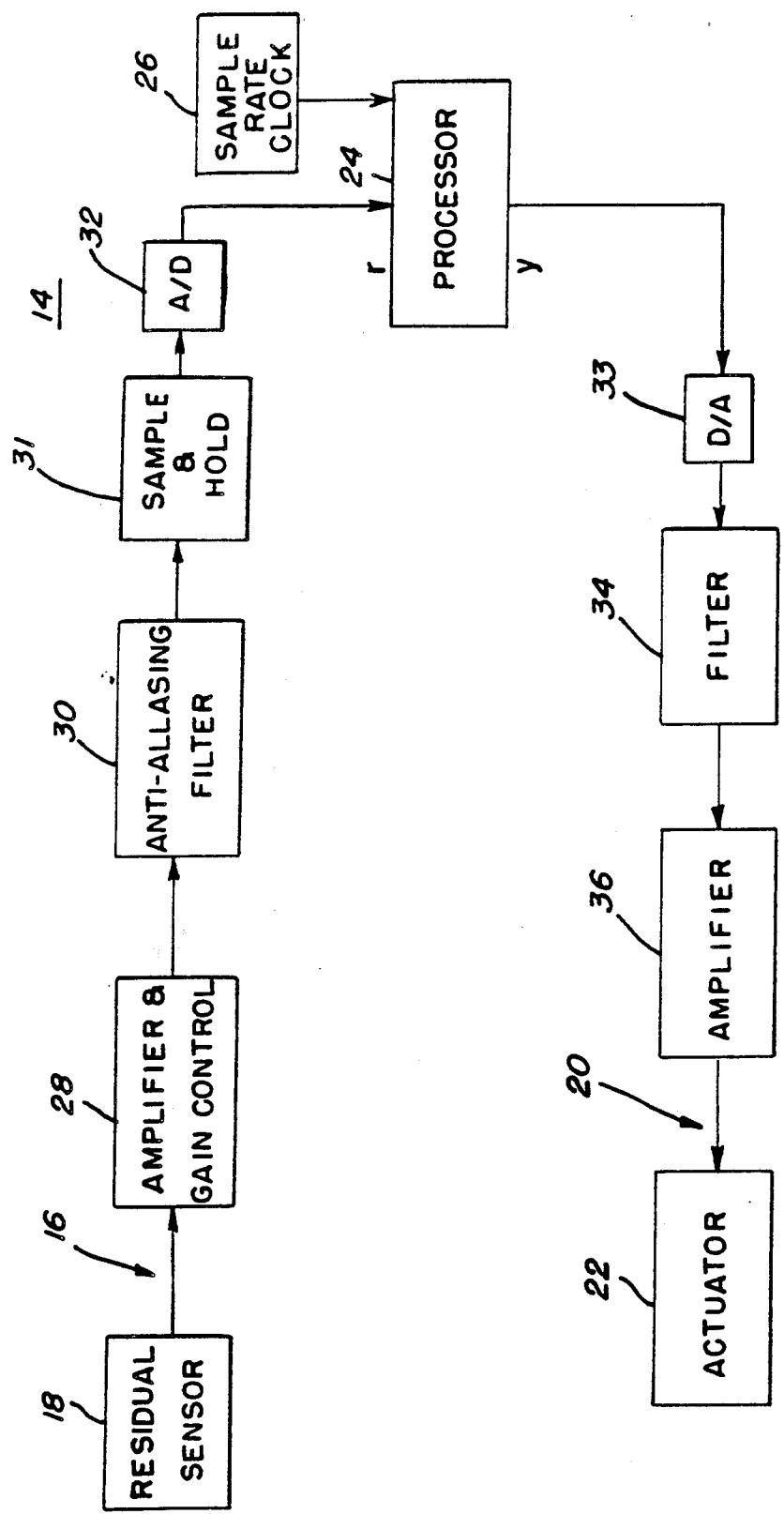
FIG. 2 is a more detailed block diagram of the digital virtual earth active cancellation system of FIG. 1 constructed in accordance with an embodiment of the present invention.

FIG. 2 shows in more detail the active cancellation system of the present invention, hereinafter referred to with reference numeral 14. The active cancellation system 14 has an input 16 that receives residual noise signals (the "residual") from a residual sensor 18. From this input, the active cancellation system 14 provides an output signal at an output 20 to an actuator 22.

The actuator 22 produces cancelling phenomena from an electronic waveform (the output signal) into the area to be controlled. The cancelling phenomena interacts with the original phenomena so that the two sum algebraically. The actuator 22 can be, for example, a loudspeaker, headphone or other acoustic actuator, electro-mechanical, electo-hydraulic, piezoelectric or other vibration actuator, or electronic mixing circuit.

The residual sensor 18 detects the result of the algebraic summing of the original phenomena and the cancelling phenomena and converts this into an electronic waveform that represents the residual. The residual sensor 18 can be, for example, a microphone, an accelerometer, pressure sensor or the output of an electronic mixing circuit.

The cancellation controller 14 has phenomena input electronic circuitry comprising an amplifier and gain control section 28, anti-aliasing filters 30, a sample and hold circuit 31, and analog to digital converter 32. Other embodiments of input electronic circuitry could be used to provide the processor 24 with a digitally processable signal.

The processor 24 utilizes the residual signal r and what is known as the system impulse response to produce a cancellation signal. The system impulse response of the controller 14 includes the impulse response E from the input circuitry 28, 30, 31, 32 and the impulse response S from the output circuitry 33, 34, 36 described below. The processor 24 needs to have either prior knowledge of the system impulse response or a means for measuring this response. Such a means will be described in more detail later.

The processor 24 also includes a sample rate clock 26 which sets the rate at which samples of the residual signal and the cancellation signal are processed. The sample rate clock need not be related to the rate at which the phenomena to be cancelled is being produced. The sample rate is set appropriately for the frequencies required to be cancelled according to the well-known Nyquist criterion. Although shown separately in FIG. 2, the sample rate clock could also be provided internally in the processor 24, such as in the processor manufactured by Texas Instruments TMS320C25 or could be provided as shown by an external oscillator.

The output electronic circuitry 33, 34, 36 converts the output of the processor 24, the cancellation signal y, into a cancelling waveform. The embodiment of the output electronic circuitry shown in FIG. 2 includes a digital to analog converter 33, a reconstruction filter 34 that removes a sampling frequency, and an amplifier 36. Other embodiments of the output electronic circuitry could be used instead of that shown in FIG. 2 to provide the cancelling waveform.

Figure 3:
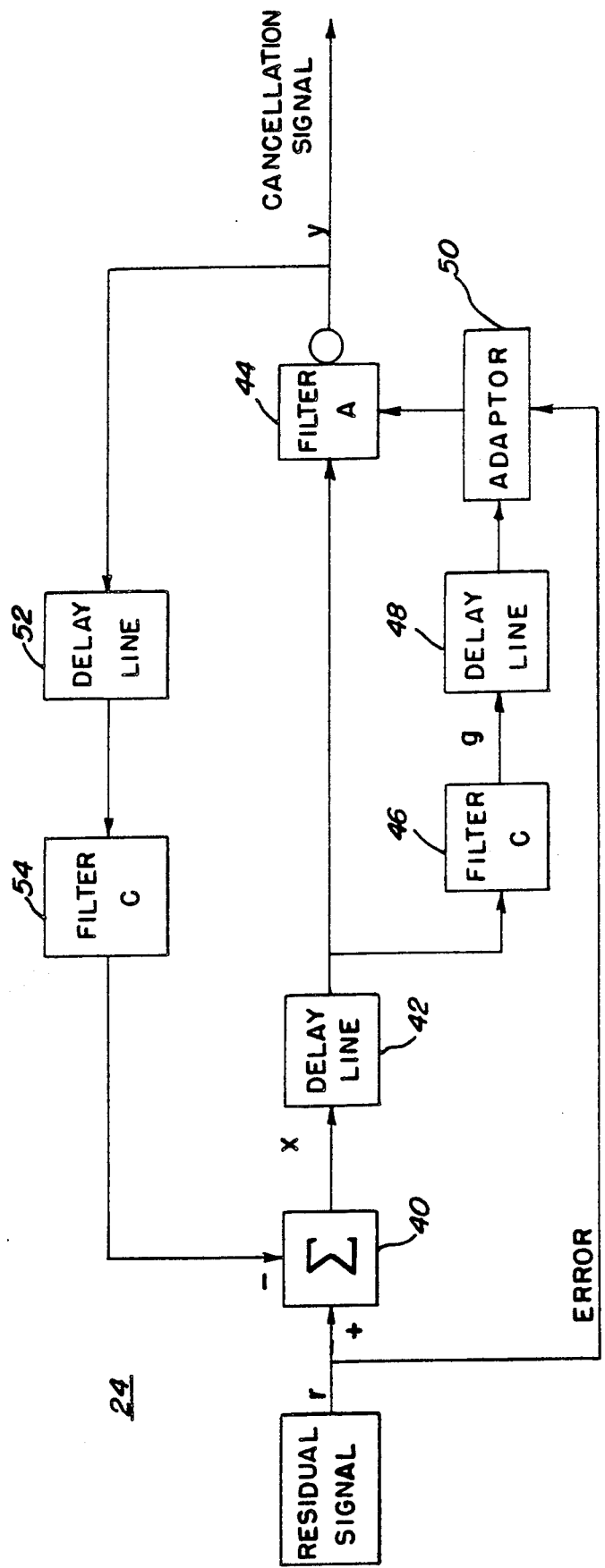
FIG. 3 is a block diagram of an embodiment of a processor constructed in accordance with the present invention used in the system of FIG. 2.

A block diagram of the processor 24 is shown in FIG. 3. The processor 24 can be implemented in various forms including fixed program hardware, custom chips or in one or more stored programmed microprocessors. The processor 24 receives the residual signal r from the electronic input circuitry. The residual signal r is provided to an adder 40. A delay line 42 is coupled to the adder 40. An adaptive filter 44 having filter weights A is coupled to the output of the delay line 42. The output of the adaptive filter 44 is inverted and forms the cancellation signal y. The output of the delay line 42 is also provided to a second filter 46 that has an impulse response. The output of the second filter 46 is provided to a second delay line 48. An adaptor 50 receives the delayed signal from the delay line 48, as well as the residual signal r from the input of the processor 24. The adaptor 50 provides an adaptation signal to the filter 44 to adjust the adaptive filter weights A.

The cancellation signal y is fed back to a third delay line 52 and the delayed cancellation signal is then provided to a filter 54 having an impulse response C. The output of the filter 54 is provided as a negative input to the adder 40, where it is combined with the residual signal r. For a specific sample K, the processor output Y is equal to $$\underline{z}_k = \underline{r}_k - \underline{y}_{k-1} \cdot \underline{C}_k$$

$$y_k = -\underline{A}_k \underline{z}_k$$

where:

$y_k$ is the cancellation output value, $\underline{y}_{k-1}$ is a vector of previous cancellation output values, $\underline{C}_k$ is a vector of filter coefficients approximating S * E, $\underline{z}_k$ is a vector of estimates of the noise, $\underline{r}_k$ is a vector of most recent values of the residual signal, $\underline{A}k$ is a vector of cancellation filter coefficients and
$a \cdot b$ is the dot product of the two vectors.

When an LMS algorithm is used the cancellation filter coefficients are adapted as $$g_k = \underline{C}_k \underline{x}_k$$

$$\underline{A}k+1 = \underline{A}k + a^r k \ \underline{g}k$$

Where:
$g_k$ is the result of convolving $\underline{C}_k$ and $\underline{x}_k$,
$\underline{g}_k$ is a vector of the most recent values of $g_k$ and
$a$ is set for convergence.

The following is a simplified description of the processing shown in FIG. 3, along with the equations set forth above. The output of the adder 40 is an estimate of the noise ($\underline{x}_k$) in vector form. Thus, $\underline{x}_k$ is an estimate of n * E, the noise as effected by the input impulse response E.

The estimated noise vector $\underline{x}_k$ is provided as an input to the adaptive filter 44 that has a filter weight A. The filter weights A are controlled by the adapter 50. The estimated noise signal vector $\underline{x}_k$ is also sent to the filter 46 having an impulse response C. This impulse response C is an estimate of the impulse response for the entire system (S * E). Thus, the estimated noise vector $\underline{x}_k$ is convolved with $c_k$ by the filter 46 to form a convolved signal $g_k$ that is delayed by delay line 48.

The value of $g_k$ is combined in the adapter 50 with the residual signal $e_k$ from the processor input. The old value of the filter weight $\underline{A}k$ is changed by an amount $r_k$ $g_k$ to provide the new filter weight $\underline{A}k+1$. Thus, the filter weights A for adaptive filter 44 are continuously adapted. By convolving the estimated noise signal $\underline{x}_k$ with $\underline{C}_k$ (an estimate of S * E), the values which are sent to the adapter 50 will be kept within the 90° phase of the residual signal r.

The filter 54 takes a cancellation signal $y_k$ and convolves it with the C, the estimate of the system impulse response S * E, and provides this value to the adder 40. The adder 40 then produces a value $\underline{x}_k$ that represents the residual signal $\underline{r}_k$ with the effects of the cancellation signal $y_k$ subtracted therefrom. This provides an estimate of the noise value $\underline{x}_k$ from which the cancellation signal y is produced by the adaptive filter 44.

In general the phase correction is accomplished by convolving the estimated noise values $\underline{x}_k$ with the system impulse response S * E as described above. However, in some environments, it is sufficient to delay the estimated noise values $\underline{x}_k$ by the delay that is introduced between the processor output and the residual value input. This delay can be caused by the anti-aliasing filters, reconstruction filters and delays in the environment, such as the distance between the actuator and the residual sensor.

In summary, the processor 24 provides the following:
1. Means for determining and updating the system impulse response C if not known a priori;
2. Means for storing the impulse response filter coefficients C;
3. Means for delaying previous values of the cancellation signal y;
4. Means for convolving the impulse response filter coefficients C with a delay line of previous values of the cancellation signal;
5. Means for making the most recent sample of the residual signal r available for processing;
6. Means for subtracting the result of the above convolution from the most recent sample of the residual signal r to produce an estimate x of the noise.
7. Means for delaying values of the estimates x of the noise.
8. Means for convolving a delay line with cancellation filter weights A;
9. Means for storing the filter weights A;
10. Means for convolving a delay line of x values with the system impulse response and thereby producing signal g to maintain the adaptation of the filter weights A within a 90° phase of the phenomena or residual signal r;
11. Means for delaying values of the signal g; and
12. Means for adapting the filter weights A utilizing the residual signal value and the delay line of g to minimize a function of the residual signal r, such as an LMS algorithm.

As stated earlier, the cancellation produced by the digital virtual earth system depends on the characteristics of the noise and on the delays represented by the impulse responses S and E. Repetitive noises are cancelled since the adaptive filter 44 produces an estimate (or predictor) of the repetitive frequency components. This occurs automatically without the need for synchronization. The cancellation of non-repetitive noise will be affected by the system impulse response. Those frequency components that are sufficiently stable to be correlated over the time period of the system delays imposed by the system impulse response and the adaptation time of the adaptive filter 44 can be cancelled by the present invention. However, less stable noise components and random noise are not cancelled when there are non-zero delays.

Figure 4:
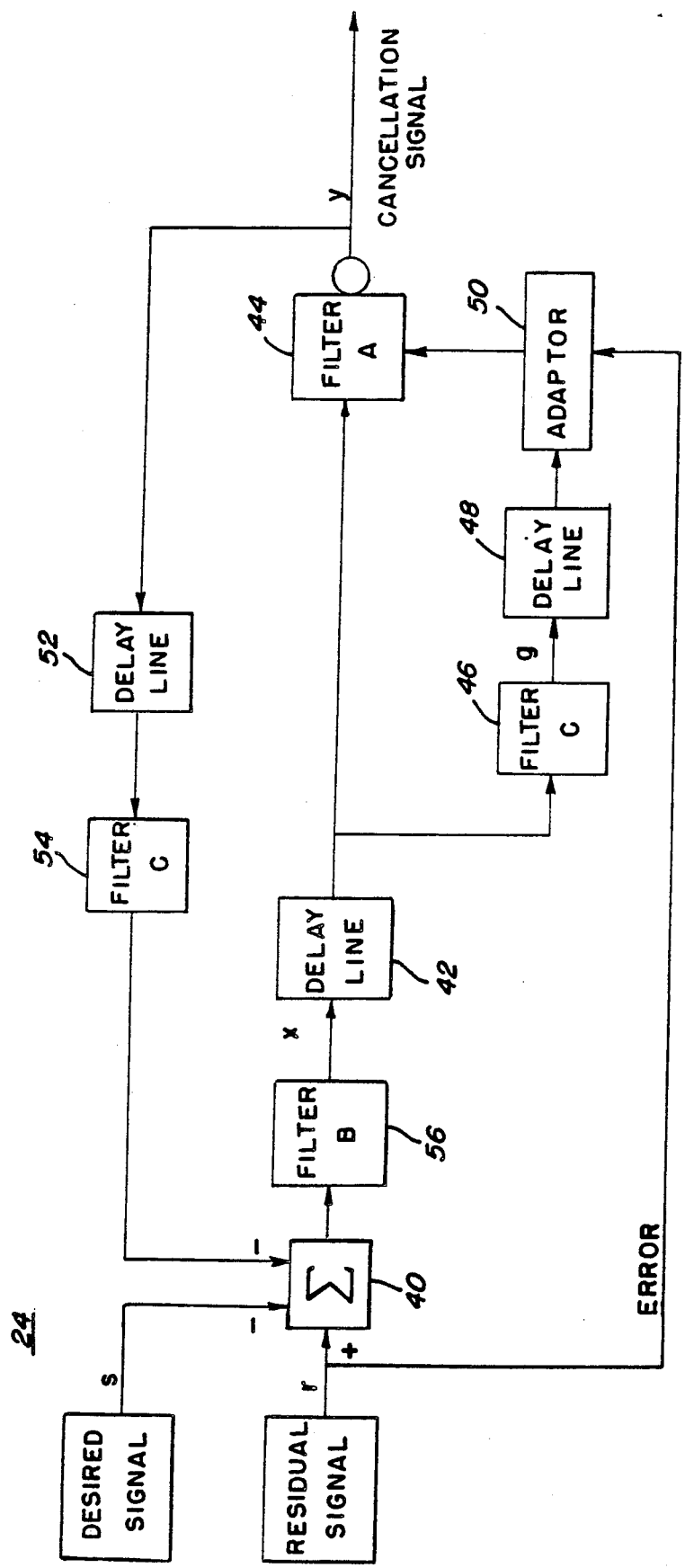
FIG. 4 is a block diagram of another embodiment of a processor constructed in accordance with the present invention used in the system of FIG. 2.

In certain applications, the system 14 using the process of FIG. 3 could cancel frequency components that are actually desired and should not be cancelled. Examples include alarms, speech and other types of frequency signals. To prevent this, the processor 24 can be modified as shown in the embodiment of FIG. 4 to remove the wanted signals or signal components from the residual signal r. A desirable signal s, such as a communication signal, can be subtracted from the residual signal r to prevent its cancellation.

The processor 24 of FIG. 4 has an additional filter 56 located between the adder 40 and delay line 42. This filter 56 has a filter weight B. The filter 56 removes the desirable frequency components s, or causes the signal s with the desirable characteristics to be uncorrelated and thereby prevents its cancellation. For example, when low frequency repetitive noise is to be cancelled in headphones without cancelling speech, such as in propeller aircraft or industrial factories, the filter 56 can be a low pass filter that removes higher frequencies and/or a delay that causes speech to be uncorrelated.

The impulse response filter coefficients C of filters 46 and 54, which are estimates of the system impulse response, must also account for the effects of filter 56. Therefore, the impulse response filter coefficients C of the filters 46, 54 will be a convolution of the impulse responses B * S * E.

Figure 5:
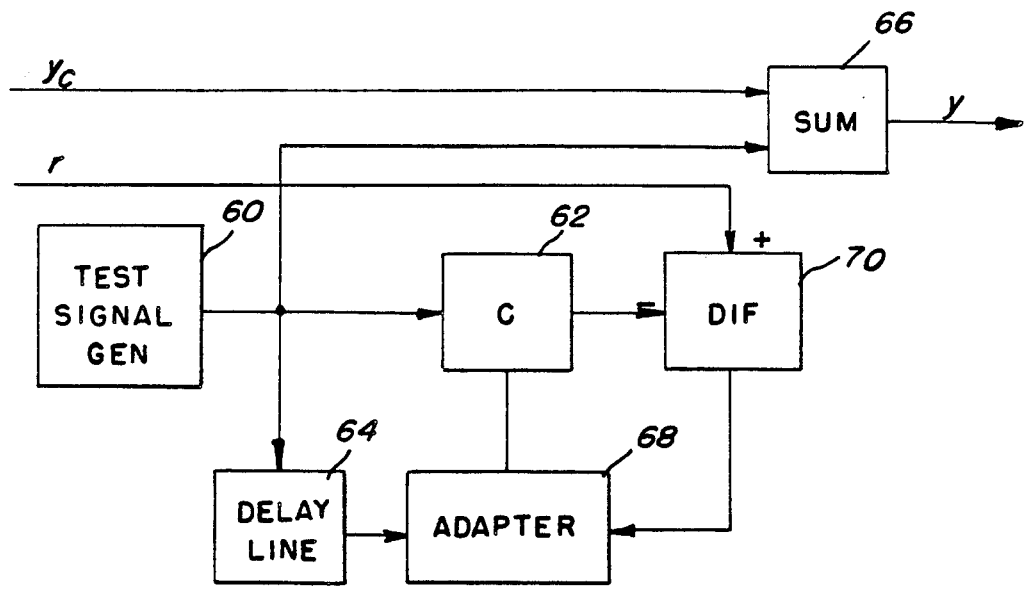
FIG. 5 is a block diagram of a system impulse response measurement circuit constructed in accordance with an embodiment of the present invention.

The effects of B, S and E may be known in advance to allow the values of the system impulse to be built into the processor 24. More typically, the effects of B, S and E are not known in advance or they change over time, and so must be measured. A means of measuring the system impulse response of B, S and E is shown in FIG. 5. (This means can, of course, also measure the system impulse response for the FIG. 3 embodiment of the processor 24.) A pseudo random test signal generator 60 is coupled to an adaptive filter 62, the coefficients of which are copied into filters 46 and 54. The pseudo random test signal is stored in a delay line 64 and added to cancellation output $y_c$ at adder 66 to form the cancellation signal y. The weights of the adaptive filter 62 are adjusted by adapter 68 that uses a minimization algorithm, such as an LMS algorithm, by using the difference from a difference circuit 70. The difference circuit 70 produces the difference between the residual signal r and a convolution of the contents of the delay line 64 and the filter weights for filter 62. When an LMS algorithm is used, the filter weights ar updated by:

$$\underline{c}_{k+1} = \underline{c}_k + \text{alphaC} * (r_k - \underline{c}_k \cdot \underline{PRTS}_k) * \underline{PRTS}_k$$

where $\underline{c}_k$ is the vector of filter weights at sample k;
$\underline{PRTS}_k$ is the delay line of pseudo random test signal values;
$\underline{c}_k \cdot \underline{PRTS}_k$ is the dot product of the vectors;
r is the residual signal value; and
alphaC is set for convergence.

The resulting filter weights $\underline{c}_k$ approximate the system impulse response and are used by the processor 24. One method for generating the pseudo random test signal is the use of a maximal length sequence generator. This sequence can be generated by:

$$d[t] = d[t-28] \text{ xor } d[t-31]$$

where:
d[t] is the binary value of the sequence of time t.
The test signal is generated by:
+test signal value, d[t]=1,
−test signal value, d[t]=0.

Other methods of measuring the system impulse response are available, and include a swept sine signal, and impulse generator, and a pseudo random test signal correlated with a response.

Although the present invention has been described and illustrated in detail, it is to be clearly understood that the same is by way of illustration and example only, it is not to be taken by way of limitation. The spirit and scope of the present invention are to be limited only by the terms of the appended claims.

What is claimed:

1. An active cancellation system comprising:
   a sensor which detects repetitive or non-repetitive phenomena and produces a residual signal;
   input circuitry coupled to the sensor which converts the residual signal into a digitally processable form, said input circuitry having an input impulse response;
   output circuitry which converts a cancellation signal into a cancelling waveform, said output circuitry having an output impulse response, the input impulse response convolved with the output impulse response being equal to a system impulse response;
   an actuator coupled to said output circuitry which converts the cancelling waveform into a cancelling phenomena; and
   a processor coupled to said input circuitry and said output circuitry, which receives said residual signal and produces a cancellation signal, said processor including:
   means for subtracting the effects of a cancellation signal from the residual signal to produce an estimated noise value;
   means for convolving the estimated noise values with cancellation filter coefficients;
   means for adjusting the estimated noise value to be within 90° phase of the residual signal; and
   means for adapting the cancellation filter coefficients.

2. The system of claim 1, wherein the means for adjusting includes means for convolving the estimated noise value with the system impulse response.

3. The system of claim 2, wherein the means for convolving further includes an adaptive filter having a filter weight which is adapted in dependence with the result of the convolving of the estimated noise value with the system impulse response, said adaptive filter receiving the estimated noise value as an input and producing the cancellation signal as an output in dependence on the filter weight.

4. The system of claim 3, wherein the means for subtracting includes means for convolving the cancellation signal with the system impulse response, and an adder that subtracts the cancellation signal convolved with the system impulse response from the residual signal to produce the estimated noise value.

5. The system of claim 4, wherein the means for convolving the cancellation signal with the system impulse response includes a filter having a filter coefficient approximately equal to the system impulse response, said filter receiving the cancellation signal as an input.

6. The system of claim 4, wherein the means for convolving the cancellation signal with the system impulse response includes means for measuring the system impulse response, and a second adaptive filter which has a filter weight adapted to be approximately equal to the system impulse response.

7. The system of claim 2, wherein the means for convolving the estimated noise value with the system impulse response includes a filter having a filter coefficient approximately equal to the system impulse response, said filter receiving the estimated noise value as an input.

8. The system of claim 2, further comprising means for measuring the system impulse response.

9. The system of claim 8, wherein the means for measuring the system impulse response includes:
   a pseudo random test signal generator that produces a random test signal;
   a second adaptive filter coupled to the test signal generator to receive said pseudo random test signal as an input and produce a filtered random test signal as an output;
   a difference circuit coupled to the second adaptive filter, said difference circuit forming a difference between the filtered pseudo random test signal and the residual signal;
   a delay line coupled to the pseudo random test signal generator and receiving as an input the pseudo random test signal, and producing a delayed pseudo random test signal;
   an adapter having one input coupled to the delay line, another input coupled to the difference circuit, and an output coupled to the second adaptive filter, said adapter receiving the difference and the delayed random test signal as inputs and providing at its output a filter weight for the second adaptive filter, said filter weight approximating the system impulse response.

10. The system of claim 2, wherein the means for convolving the estimated noise with the system impulse response includes means for measuring the system impulse response, and a second adaptive filter which has a filter weight adapted to be approximately equal to the system impulse response.

11. The system of claim 1, further comprising:
means for subtracting a desirable signal from the residual signal such that said desirable signal is not cancelled.

12. The system of claim 11, wherein the means for subtracting a desirable signal includes a low pass filter.

13. The system of claim 11, wherein the means for subtracting a desirable signal includes a delay that causes said desirable signal to be uncorrelated.

14. A processor for an active cancellation system that detects repetitive phenomena, produces a residual signal and provides a cancelling repetitive phenomena, the active cancellation system having a system impulses response, the processor comprising:
means for receiving a residual signal; and
means for producing from the residual signal a cancellation signal to be converted into a cancelling repetitive phenomena, said means for producing including,
means for subtracting effects of a cancellation signal from a residual signal to produce an estimated noise valve, and
means for adjusting the estimated noise value to be within 90° phase of the residual signal.

15. The processor of claim 14, wherein the means for adjusting includes means for convolving the estimated noise value with the system impulse response.

16. The system of claim 2, wherein the means for convolving further includes an adaptive filter having a filter weight which is adapted in dependence with the result of the convolving of the estimated noise value with the system impulse response, said adaptive filter receiving the estimated noise value as an input and producing the cancellation signal as an output in dependence on the filter weight.

17. The process of claim 16, wherein the means for subtracting includes means for convolving the cancellation signal with the system impulse response, and an adder that subtracts the cancellation signal convolved with the system impulse response from the residual signal to produce the estimated noise value.

18. The processor of claim 17, wherein the means for convolving the cancellation signal with the system impulse response includes a filter having a filter coefficient approximately equal to the system impulse response, said filter receiving the cancellation signal as an input.

19. The processor of claim 15, wherein the means for convolving the estimated noise value with the system impulse response includes a filter having a filter coefficient approximately equal to the system impulse response said filter receiving the estimated noise value as an input.

20. The processor of claim 17, wherein the means for convolving the cancellation signal with the system impulse response includes means for measuring the system impulse response, and a second adaptive filter which has a filter weight adapted to be approximately equal to the system impulse response.

21. The processor of claim 15, further comprising means for measuring the system impulse response.

22. The processor of claim 21, wherein the means for measuring the system impulse response includes:
a pseudo random test signal generator that produces a random test signal;
a second adaptive filter coupled to the test signal generator to receive said pseudo random test signal as an input and produce a filtered pseudo random test signal as an output;
a difference circuit coupled to the second adaptive filter, said difference circuit forming a difference between the filtered pseudo random test signal and the residual signal;
a delay line coupled to the pseudo random test signal generator and receiving as an input the pseudo random test signal, and producing a delayed pseudo random test signal;
an adapter having one input coupled to the delay line, another input coupled to the difference circuit, and an output coupled to the second adaptive filter, said adapter receiving the difference and the delayed pseudo random test signal as inputs and providing at its output a filter weight for the second adaptive filter, said filter weight approximating the system impulse response.

23. The processor of claim 15, wherein the means for convolving the estimated noise with the system impulse response includes means for measuring the system impulse response, and a second adaptive filter which has a filter weight adapted to be approximately equal to the system impulse response.

24. The processor of claim 14, further comprising:
means for subtracting a desirable signal from the residual signal such that said desirable signal is not cancelled.

25. The processor of claim 24, wherein the means for subtracting a desirable signal includes a band reject filter.

26. The processor of claim 24, wherein the means for subtracting a desirable signal includes a delay that causes said desirable signal to be uncorrelated.

27. A processor for an active cancellation system that detects repetitive phenomena, produces a residual signal and provides a cancelling repetitive phenomena, the active cancellation system having a system impulse response, the processor comprising:
means for receiving a most recent residual signal;
means for determining the system impulse response;
means for storing filter coefficients that are approximations of the system impulse response;
means for delaying previous values of a cancellation signal;
means for convolving the filter coefficients with delayed previous values of a cancellation signal;
means for subtracting the convolved filter coefficients with the most recent residual signal to produce an estimate of noise;
means for delaying the estimate of noise;
means for storing cancellation filter weights;
means for convolving the estimate of noise with a cancellation filter weight to produce a cancellation signal to be converted into a cancelling repetitive phenomena;
means for convolving the delayed estimate of noise with the system impulse response to produce a convolved signal to maintain adaptation of the cancellation filter weight within 90° phase of the repetitive phenomena or the residual signal;
means for delaying the convolved signal; and means for adapting the cancellation filter weight using the residual signal and the delayed convolved signal to minimize a function of the residual signal.

28. The processor of claim 27, further comprising:
means for subtracting a desirable signal from the residual signal such that said desirable signal is not cancelled.

29. The processor of claim 28, wherein the means for subtracting a desirable signal includes a band reject filter.

30. The processor of claim 28, wherein the means for subtracting a desirable signal includes a delay that causes said desirable signal to be uncorrelated.

31. A method of processing a residual signal from an active cancellation system and providing a cancellation signal to the active cancellation system, comprising the steps of:
receiving a most recent residual signal;
determining the system impulse response;
storing filter coefficients that are approximations of the system impulse response;
delaying previous values of a cancellation signal;
convolving the filter coefficients with delayed previous values of a cancellation signal;
subtracting the convolved filter coefficients with the most recent residual signal to produce an estimate of noise;
delaying the estimate of noise;
storing cancellation filter weights;
convolving the estimate of noise with a cancellation filter weight to produce a cancellation signal to be converted into a cancelling repetitive phenomena;
convolving the delayed estimate of noise with the system impulse response to produce a convolved signal to maintain adaptation of the cancellation filter weight within 90° phase of the repetitive phenomena or the residual signal;
delaying the convolved signal; and
adapting the cancellation filter weight using the residual signal and the delayed convolved signal to minimize a function of the residual signal.

32. The method of claim 31, further comprising the step of
subtracting a desirable signal from the residual signal such that said desirable signal is not cancelled.

* * * * *